United States Patent
Chen

(10) Patent No.: US 7,838,202 B2
(45) Date of Patent: Nov. 23, 2010

(54) METHOD FOR MANUFACTURING PATTERNED THIN-FILM LAYER

(75) Inventor: Chien-Hung Chen, Hsinchu (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 609 days.

(21) Appl. No.: 11/946,262

(22) Filed: Nov. 28, 2007

(65) Prior Publication Data
US 2009/0011142 A1     Jan. 8, 2009

(30) Foreign Application Priority Data
Jul. 6, 2007    (TW) ............... 96124614 A

(51) Int. Cl.
*G03F 7/26* (2006.01)
(52) U.S. Cl. ............ 430/315; 430/394; 430/321; 347/101
(58) Field of Classification Search ........ 430/330, 430/328, 324, 315, 312, 320, 321, 394; 347/101, 347/80, 40, 70
See application file for complete search history.

(56) References Cited

U.S. PATENT DOCUMENTS

2002/0067400 A1*   6/2002   Kawase et al. ............. 347/101

\* cited by examiner

*Primary Examiner*—Kathleen Duda
*Assistant Examiner*—Caleen O Sullivan
(74) *Attorney, Agent, or Firm*—Jeffrey T. Knapp

(57) ABSTRACT

A method for manufacturing a patterned thin-film layer includes the steps of: providing a substrate with a plurality of banks thereon, the plurality of banks defining a plurality of spaces therein for receiving ink therein, each of the banks having a top surface; providing a UV light source for emitting UV light toward the substrate; disposing a photo mask between the UV light source and the substrate; applying UV light on the substrate through the photo mask so as to reduce surface wettability of the ink on the top surfaces of the substrate, wherein the UV light is applied in a manner that the top surfaces of the banks are blocked by the photo mask and thus free of radiation from the UV light emitted from the UV light source; applying the ink into the spaces; and curing the ink so as to form a patterned thin-film layer on the substrate.

15 Claims, 7 Drawing Sheets

(a)

(b)

(c)

US 7,838,202 B2

METHOD FOR MANUFACTURING PATTERNED THIN-FILM LAYER

BACKGROUND

1. Field of the Invention

The present invention generally relates to a method for manufacturing patterned thin-film layer on a substrate.

2. Description of Related Art

At present, methods for manufacturing a patterned thin-film layer on a substrate include a photolithographic method and an ink-jet method.

The photolithographic method is described as below: applying a photoresist layer on a substrate; exposing the photoresist layer using a photo mask with a predetermined pattern and developing the exposed photoresist layer using the conventional method to form a predetermined patterned thin-film layer. Disadvantage of the conventional photolithographic method is that a large part of the photoresist material is wasted thus, the efficiency is lowered.

Referring to FIG. 7, the ink-jet method includes following steps: referring to FIG. 7(a), a substrate 42 with a plurality of banks 44 thereon is provided, wherein the plurality of banks 44 defining a plurality of spaces 46 therein; the surfaces of the banks 44 is irradiated by ultraviolet (UV for short hereinafter) light beams 48 perpendicular to the top surface of the banks 44. Referring to FIGS. 7(b) and 7(c), ink 54 is deposited into the spaces 46 by a nozzle 52. A patterned thin-film layer (not shown) is formed after the ink 54 being cured.

In the ink-jet method, ink with an appropriate viscosity and a surface tension is necessary (see "the Fluid Property Dependency on Ink Jetting Characteristics", Proceedings of the 2005 IEEE, pp. 258-260, 2005.11). Therefore, ink applied to the ink-jet method must have a certain level of viscosity and a certain level of surface tension in order to increase surface wettability of the ink on the substrate 42 and the banks 44. Alternatively, a method of irradiating the substrate 42 and the banks 44 with UV light, as shown in FIG. 7(a), is being applied to increase surface wettability of the ink on the substrate 42 and the banks 44.

In FIG. 7(a), the UV light beams 48 can decompose non-hydrophile substance, and thus increase the surface wettability of the top surfaces of the banks 44. If a material of the banks 44 is an organic material, the UV light beams 48 also can break the unsaturated links of the organic material adjacent of the outer surface of the banks 44. This will further increase the surface wettability of the top surface of the banks 44. In FIG. 7(c), the UV light beams perpendicularly irradiate the top surfaces of banks 44, which have better surface wettability than the side surfaces of banks 44. Therefore, when an ink 542 deposited in the space 46 overflows to the top surface of the bank 44, the ink 542 is prone to flowing along the top surfaces of the bank 44 and is mixed with an ink 544 adjacent to the ink 542. This may reduce purity of the ink in the same space.

What is needed, therefore, is a method for manufacturing a patterned thin-film layers with high purity of the ink in the same space.

SUMMARY

In a first present embodiment of the present invention, a method for manufacturing a patterned thin-film layer according to one present embodiment includes the steps of: providing a substrate with a plurality of banks thereon, the plurality of banks defining a plurality of spaces therein, each of the banks having a top surface; providing a UV light source and a photo mask, wherein the photo mask includes a UV light pervious portion and a plurality of UV light-blocking portions, each of the UV light-blocking portions having a pattern same as the top surfaces of the banks; disposing the photo mask between the UV light source and the substrate, wherein the UV light-blocking portion blocks the UV light from being incident onto the top surfaces of the banks; irradiating the substrate and the banks with UV light; depositing ink into the spaces; and curing the ink so as to form a patterned thin-film layer on the substrate.

In a second present embodiment of the present invention, a method for manufacturing a patterned thin-film layer, comprising the steps of: providing a substrate with a plurality of banks thereon, the plurality of banks defining a plurality of spaces therein for receiving ink therein, each of the banks having a top surface; providing a UV light source for emitting UV light toward the substrate; disposing a photo mask between the UV light source and the substrate; applying UV light on the substrate through the photo mask so as to reduce surface wettability of the ink on the top surfaces of the substrate, wherein the UV light is applied in a manner that the top surfaces of the banks are blocked by the photo mask and thus free of radiation from the UV light emitted from the UV light source; applying the ink into the spaces; and curing the ink so as to form a patterned thin-film layer on the substrate.

Advantages and novel features will become more apparent from the following detailed description of the present method for manufacturing patterned thin-film layer when taken in conjunction with the accompanying drawings.

BRIEF DESCRIPTION OF THE DRAWINGS

Many aspects of the present method for manufacturing patterned thin-film layer can be better understood with reference to the following drawings. The components in the drawings are not necessarily drawn to scale, the emphasis instead being placed upon clearly illustrating the principles of the present method for manufacturing patterned thin-film layer. Moreover, in the drawings, like reference numerals designate corresponding parts throughout the several views.

Corresponding reference characters indicate corresponding parts throughout the drawings. The exemplifications set out herein illustrate at least one present embodiment of the present method for manufacturing patterned thin-film layer, in one form, and such exemplifications are not to be construed as limiting the scope of the invention in any manner.

DETAILED DESCRIPTION OF THE EMBODIMENT

Reference will now be made to the drawings to describe present embodiments of the present method for manufacturing patterned thin-film layer using same, in detail.

Figure 1:
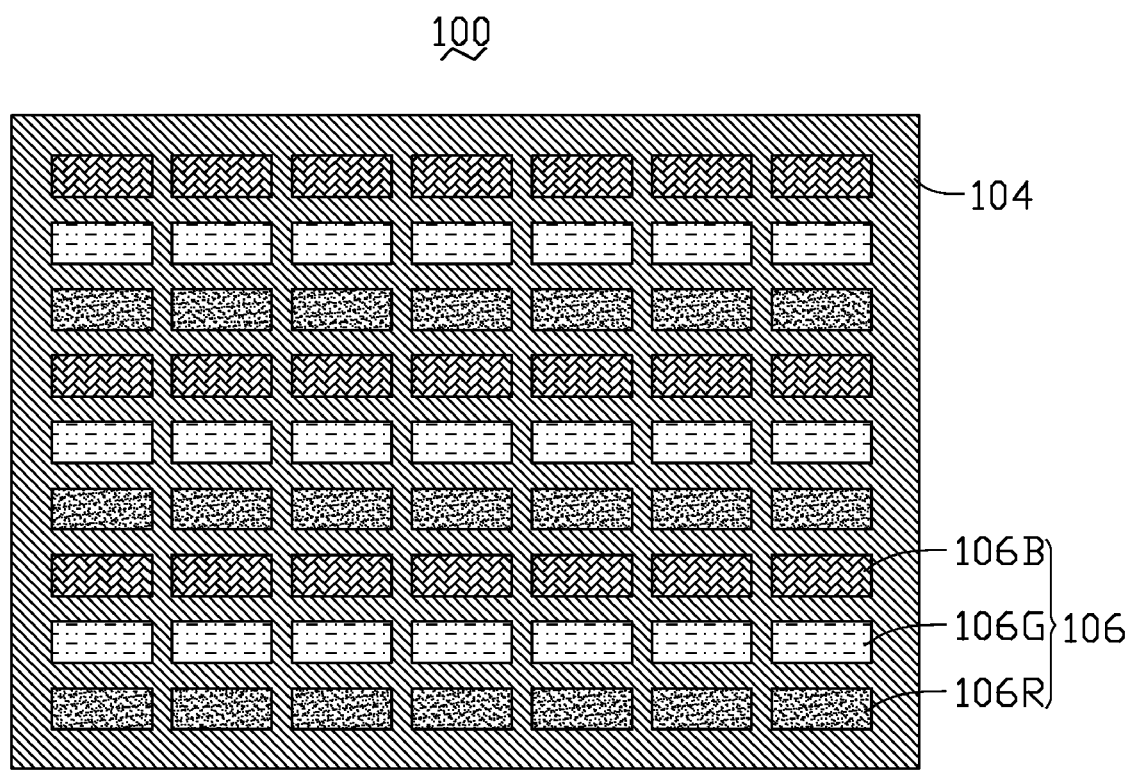
FIG. 1 is a cross-sectional view of a patterned thin-film layer in accordance with a first present embodiment.
Figure 2:
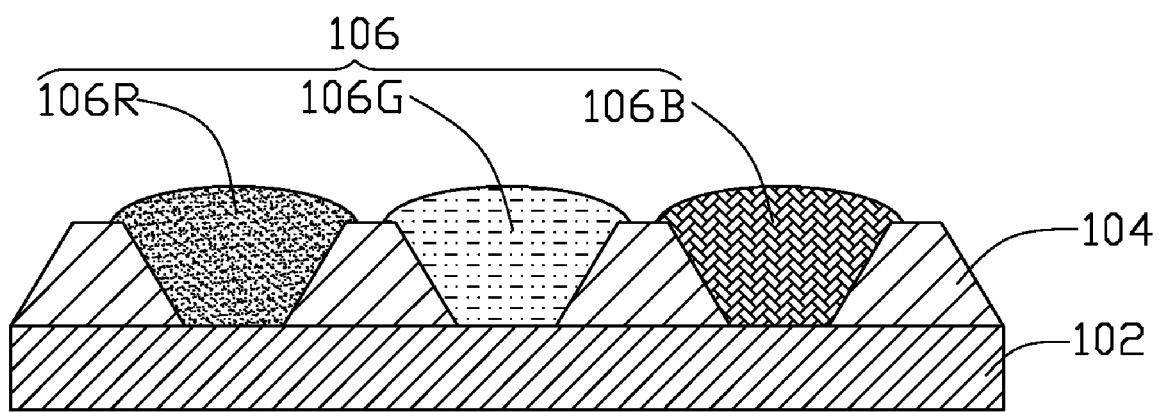
FIG. 2 is another cross-sectional view of a patterned thin-film layer of FIG. 1, showing thickness of thin-film layers.

Referring to FIGS. 1 and 2, a patterned thin-film layer 100 in accordance with a first present embodiment is shown. The patterned thin-film layer 100 includes a substrate 102, a plurality of banks 104 formed on the substrate 102, and a plurality of thin-film layers 106.

A material of the substrate 102 is selected from the group consisting of glass, quartz glass, silicon wafer, metal and plastic. The plurality of banks 104 defines a plurality of spaces therein, and the spaces are arranged in rows and columns on the substrate 102. The thin-film layers 106 in each row are made of same ink, and the thin-film layers 106 in every three rows include a first thin-film layer 106R, a second thin-film layers 106G and a third thin-film layer 106B arranged in a repeating order.

Figure 3:
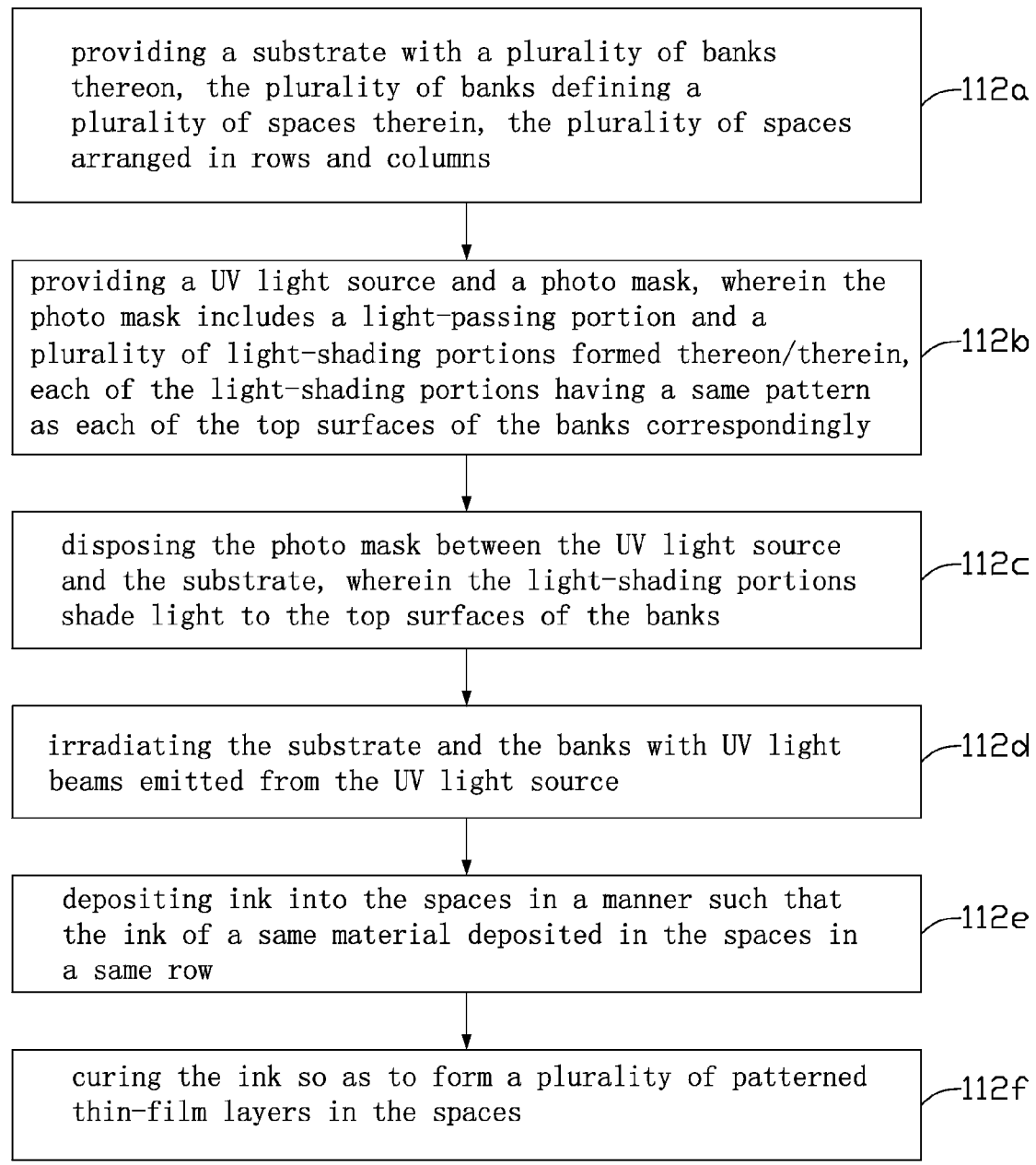
FIG. 3 is a flow chart of a method for manufacturing a patterned thin-film layer in accordance with a second present embodiment.

Referring to FIG. 3, a flow chart of a method for manufacturing a patterned thin-film layer in accordance with a second present embodiment is shown. The method mainly includes the steps of: 112a: providing a substrate with a plurality of banks thereon, the plurality of banks defining a plurality of spaces therein, the plurality of spaces arranged in rows and columns; 112b: providing a UV light source and a photo mask, wherein the photo mask includes a UV light pervious portion and a plurality of UV light-blocking portions, each of the UV light-blocking portions having a same pattern as the top surfaces of the banks; 112c: disposing the photo mask between the UV light source and the substrate, wherein the UV light-blocking portions block the UV light from incident onto the top surfaces of the banks; 112d: irradiating the substrate and the banks with UV light; 112e: depositing ink into the spaces; 112f: curing the ink so as to form a patterned thin-film layer on the substrate.

Figure 4:
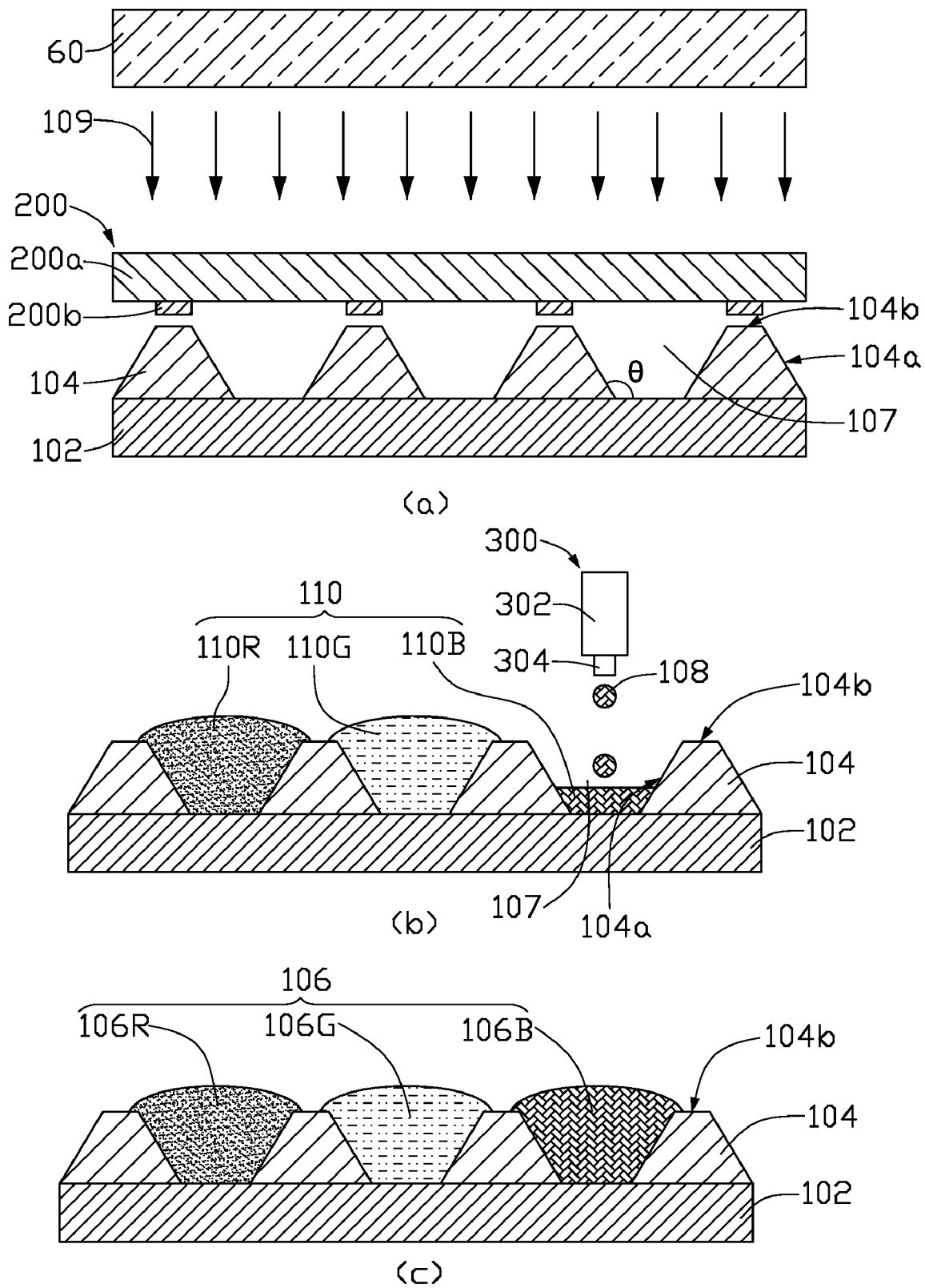
FIGS. 4a to 4c illustrate a manufacturing method of a patterned thin-film layer in accordance with the second present embodiment.

With reference to FIG. 4(a), in step 112a, a substrate 102 with a plurality of banks 104 thereon is provided. A material of the substrate 102 is selected from the group consisting of glass, quartz glass, silicon wafer, metal and plastic. A material of the banks 104 can be photoresist resin. In the present embodiment, the substrate 102 is a glass substrate. The plurality of banks 104 defines a plurality of spaces 107 therein. Generally, the plurality of spaces 107 is arranged in rows and columns. Each of the banks 104 has a plurality of side surfaces 104a and a top surface 104b. Each of the side surfaces 104a is inclined with respect to the substrate 102. An inclination angle θ that the side surfaces 104a with respect to the substrate 102 is smaller than 90 degrees. Also, the spaces 107 can be arranged in a mosaic style or an abnormity style etc.

In step 112b, a UV light source 60 and a photo mask 200 is provided. The UV light source 60 emits UV light 109. The UV light source 60 is preferably a straight tube UV lamp with low pressure therein. A wavelength of the UV light source 60 is preferably shorter than 320 nanometers. The photo mask 200 includes a UV light pervious portion 200a and a plurality of UV light-blocking portion 200b formed on the UV light pervious portion 200a corresponding with 104. The UV light-blocking portions 200b have a same pattern as the top surfaces 104b of the banks 104. In step 112c, the photo mask 200 is disposed between the UV light source 60 and the substrate 102. The UV light-blocking portions 200b overcast the top surfaces 104b of the banks 104 so as to block UV light 109 emitted from the UV light source 60 to the top surfaces 104. It is to be understood that the UV light-blocking portion 200b also can be arranged in the UV light pervious portion 200a. A material of the photo mask 200 can be selected from a group consisting of Chromium and resin material.

In step 112d, the UV light source 60 emits UV light 109 perpendicular to the top surfaces 104b. One part of the UV light 109 is blocked by the UV light-blocking portions 200b so that the top surfaces 104b receive no UV light 109. Another part of the UV light 109 passes through the UV light pervious portion 200a onto the side surfaces 104a and the surfaces of the substrate 102. As a result, surface wettability of the side surfaces 104a and the surfaces of the substrate 102 are increased. It is to be understood that the UV light 109 also can incline with respect to the top surfaces 104b.

Referring to FIG. 4(b), in step 112e, ink 108 of a desired material is deposited into the spaces 107 to form ink layers 110 using an ink-jet device 300. The ink-jet device 300 includes an ink-jet head 302 with a nozzle 304 formed thereon. The ink layers 110 deposited in every three rows comprises a first ink layer 110R, a second ink layer 110G and a third ink layer 110B arranged in a repeating order.

Referring to FIGS. 4(b) and 4(c), in step 112f, the ink layers 110 in the spaces 107 are cured by a curing device (not shown), such as a heating device or an ultraviolet light source, so as to form a plurality of thin-film layers 106. The thin-film layers 106 includes a first thin-film layer 106R, a second thin-film layer 106G, and a third thin-film layer 106B corresponding to the first ink layer 110R, the second ink layer 110G and the third ink layer 110B respectively. A heating device and a vacuum-pumping device can also be used for curing the ink layers 110 defined by the banks 104.

Because the UV light-blocking portions 200b of the photo mask 200 block the UV light 109 emitted from the UV light source 60 to the top surfaces 104b of the banks 104, surface wettability of the top surfaces 1042 is weak. When the first ink layer 110R overflows to the top surface 1042, the first ink layer 110R has a high surface tension and is not prone to flowing to the adjacent second ink layer 110G. This may prevent adjacent ink layers from mixing.

Figure 5:
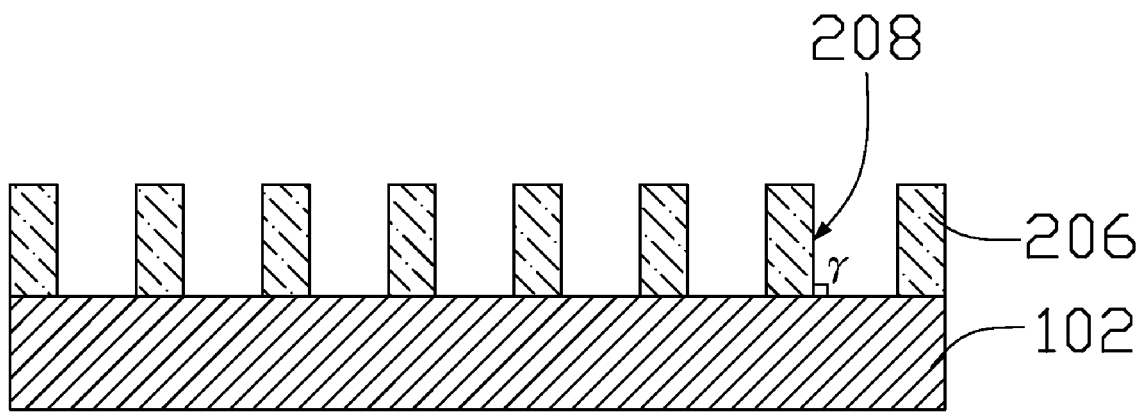
FIG. 5 is a cross-sectional view of a substrate with a plurality of banks thereon in accordance with a third present embodiment.

Besides, referring to FIG. 5, the substrate 102 with another banks 206 are illustrated in accordance with a third present embodiment. In this present embodiment, side surfaces 208 of the banks 206 and the surface of the substrate form an angle γ. The angle γ is 90 degrees.

Figure 6:
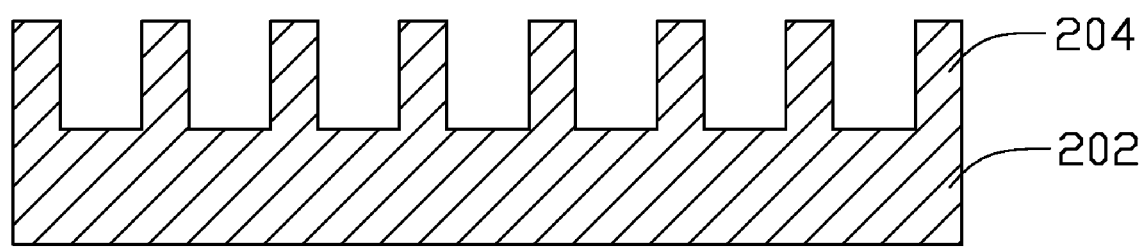
FIG. 6 is a cross-sectional view of a substrate with a plurality of banks in accordance with a fourth present embodiment.
Figure 7:
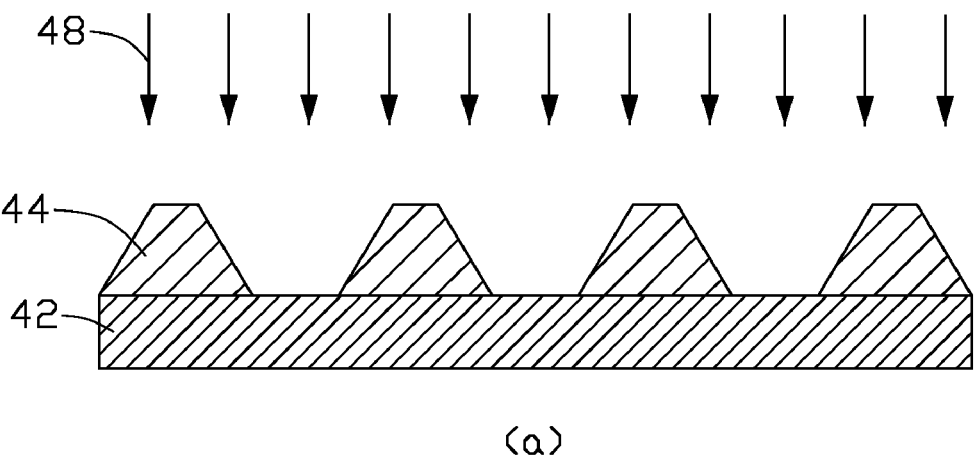
FIGS. 7a to 7c illustrate a conventionally method for manufacturing a patterned thin-film layer.
Figure 7:
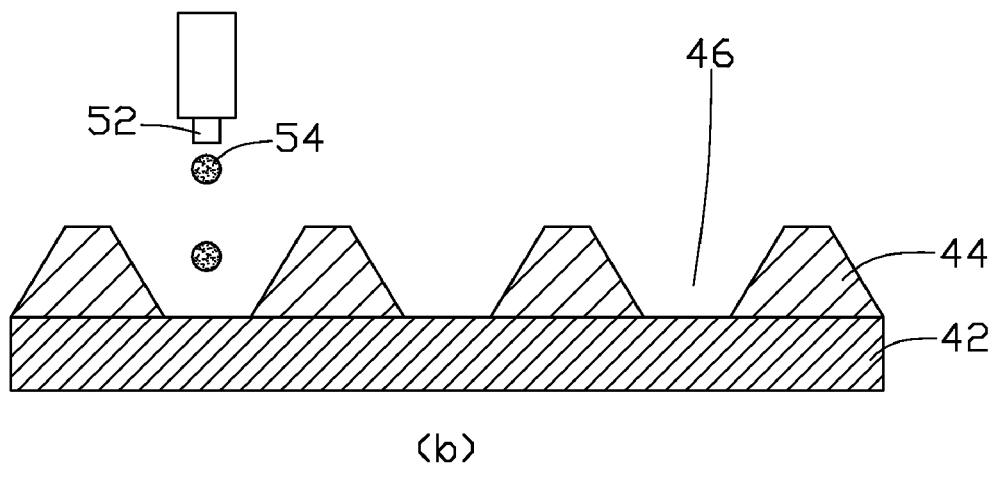
Figure 7:
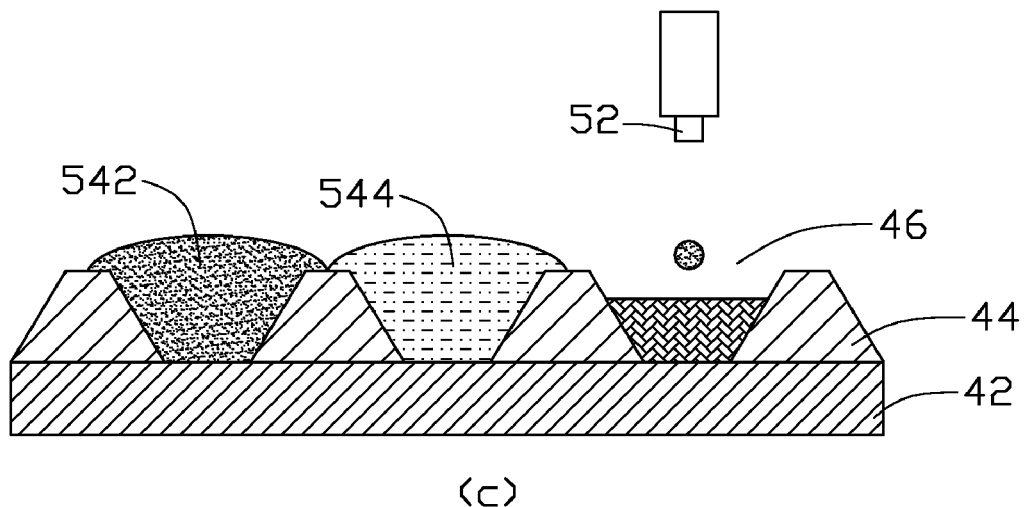

In addition, a substrate 202 and a plurality of banks 204 are illustrated in accordance with a fourth present embodiment, as shown in FIG. 6. The substrate 202 and the plurality of banks 204 are similar as the substrate 102 and the plurality of banks 206, and the difference is that the substrate 202 and the plurality of banks 204 are integrally molded.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A method for manufacturing a patterned thin-film layer, comprising the steps of:
   providing a substrate with a plurality of banks thereon, the plurality of banks defining a plurality of spaces therein, each of the banks having a top surface;
   providing a UV light source and a photo mask, wherein the photo mask includes a UV light pervious portion and a plurality of UV light-blocking portions, each of the UV light-blocking portions having a pattern same as the top surfaces of the banks;

disposing the photo mask between the UV light source and the substrate, wherein the UV light-blocking portion blocks the UV light from being incident onto the top surfaces of the banks;

irradiating the substrate and the banks with UV light;

depositing ink into the spaces; and curing the ink so as to form a patterned thin-film layer on the substrate.

2. The method as claimed in claim 1, wherein a material of the photo mask is Chromium.

3. The method as claimed in claim 1, wherein a material of the banks is photoresist resin.

4. The method as claimed in claim 1, wherein a wavelength of the UV light source is shorter than 320 nanometers.

5. The method as claimed in claim 1, wherein the UV light source is a straight tube UV lamp with low pressure therein.

6. The method as claimed in claim 1, wherein the light beams emitted from the UV light source is perpendicular to the top surfaces of the banks.

7. The method as claimed in claim 1, wherein the ink is deposited in the spaces using an ink-jet device, and the ink-jet device comprises an ink-jet head.

8. The method as claimed in claim 1, wherein the ink is cured by at least one device selected from the group consisting of a heating device, a vacuum pump, and a light-exposure device.

9. The method as claimed in claim 8, wherein the light-exposure device is an ultraviolet light source.

10. A method for manufacturing a patterned thin-film layer, comprising the steps of:

providing a substrate with a plurality of banks thereon, the plurality of banks defining a plurality of spaces therein for receiving ink therein, each of the banks having a top surface;

providing a UV light source for emitting UV light toward the substrate;

disposing a photo mask between the UV light source and the substrate;

applying UV light on the substrate through the photo mask so as to reduce surface wettability of the ink on the top surfaces of the substrate, wherein the UV light is applied in a manner that the top surfaces of the banks are blocked by the photo mask and thus free of radiation from the UV light emitted from the UV light source;

applying the ink into the spaces; and curing the ink so as to form a patterned thin-film layer on the substrate.

11. The method as claimed in claim 10, wherein a material of the photo mask is Chromium.

12. The method as claimed in claim 10, wherein a material of the banks is photoresist resin.

13. The method as claimed in claim 10, wherein a wavelength of the UV light source is shorter than 320 nanometers.

14. The method as claimed in claim 10, wherein the UV light source is a straight tube UV lamp with low pressure therein.

15. The method as claimed in claim 10, wherein the light beams emitted from the UV light source is perpendicular to the top surfaces of the banks.

* * * * *